(12) United States Patent
Xu et al.

(10) Patent No.: US 9,985,600 B2
(45) Date of Patent: May 29, 2018

(54) PRINTED CIRCUIT BOARD ASSEMBLY FOR FILTERING NOISE OF NETWORK SIGNAL TRANSMISSION

(71) Applicant: FOXCONN INTERCONNECT TECHNOLOGY LIMITED, Grand Cayman (KY)

(72) Inventors: Yong-Chun Xu, Kunshan (CN); Jian-She Hu, Kunshan (CN); Chao-Tung Huang, New Taipei (TW); Chih-Ching Hsu, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 124 days.

(21) Appl. No.: 15/088,147

(22) Filed: Apr. 1, 2016

(65) Prior Publication Data

US 2016/0294346 A1    Oct. 6, 2016

(30) Foreign Application Priority Data

Apr. 3, 2015   (CN) .......................... 2015 1 0156009
Apr. 3, 2015   (CN) .......................... 2015 1 0157540

(51) Int. Cl.
*H03H 7/09*     (2006.01)
*H01F 30/02*    (2006.01)
(Continued)

(52) U.S. Cl.
CPC ............... *H03H 7/09* (2013.01); *H01F 27/24* (2013.01); *H01F 27/28* (2013.01); *H01F 27/29* (2013.01);
(Continued)

(58) Field of Classification Search
CPC ........... H01F 27/29; H01F 30/02; H03H 7/09; H03H 7/427; H03H 7/06; H04B 3/54
(Continued)

(56) References Cited

U.S. PATENT DOCUMENTS 1,779,269 A * 10/1930 Newsome ............... H01F 30/10
                                                             336/171
7,560,825 B2    7/2009 Crawley
(Continued)

FOREIGN PATENT DOCUMENTS

CN           203851110         9/2014
TW   M397086/099217463        1/2011
(Continued)

*Primary Examiner* — Rakesh Patel
(74) *Attorney, Agent, or Firm* — Wei Te Chung; Ming Chieh Chang

(57) ABSTRACT

A printed circuit board assembly includes a printed circuit board, a number of electronic components mounted thereon, and a number of conductive traces electrically connecting the components to form a number of transmission channels. Each of the channels has first and second transmission routes for transmitting differential signals. Each channel includes a common mode choke, a pair of capacitors, and an autotransformer. The common mode choke includes a first coil series connection with the first transmission route and a second coil series connection with the second transmission route. The capacitors include a first capacitor series connection with the first transmitting route and a second capacitor series connection with the second transmitting route.

13 Claims, 8 Drawing Sheets

(51) Int. Cl.
  *H01F 27/24* (2006.01)
  *H01F 27/28* (2006.01)
  *H05K 1/11* (2006.01)
  *H01F 27/29* (2006.01)
  *H05K 1/02* (2006.01)

(52) U.S. Cl.
  CPC ........... *H01F 30/02* (2013.01); *H05K 1/0231* (2013.01); *H05K 1/0233* (2013.01); *H05K 1/0245* (2013.01); *H05K 1/111* (2013.01); *H05K 2201/09272* (2013.01); *H05K 2201/09281* (2013.01); *H05K 2201/1003* (2013.01); *H05K 2201/10015* (2013.01)

(58) Field of Classification Search
  USPC .................. 333/185, 4, 5, 175, 177; 336/148
  See application file for complete search history.

(56) References Cited

U.S. PATENT DOCUMENTS

| | | | |
|---|---|---|---|
| 7,670,183 B2 | 3/2010 | Hon Hai | |
| 7,808,751 B2 | 10/2010 | Chen et al. | |
| 8,824,570 B2 | 9/2014 | Pischl | |
| 2011/0243254 A1* | 10/2011 | Pischl | H04L 25/0276 |
| | | | 375/257 |
| 2014/0160608 A1 | 6/2014 | Ajoho | |
| 2014/0320232 A1 | 10/2014 | Wei | |
| 2017/0040968 A1* | 2/2017 | Igarashi | H03H 7/427 |

FOREIGN PATENT DOCUMENTS

| | | |
|---|---|---|
| TW | M487533/103204445 | 10/2014 |
| TW | M494409/103217919 | 1/2015 |

\* cited by examiner

PRINTED CIRCUIT BOARD ASSEMBLY FOR FILTERING NOISE OF NETWORK SIGNAL TRANSMISSION

BACKGROUND OF THE INVENTION

1. Field of the Invention

The present invention relates to a printed circuit board assembly, and more particularly to a printed circuit board assembly used in filtering noise of the network signal transmission.

2. Description of Related Arts

U.S. Pat. No. 8,824,570 discloses an Ethernet filtering circuit including a plurality of transmission channels. Each of the channels includes a common mode choke with two coils and two capacitors series connection with the two coils, respectively. The channels need not include any transformers or autotransformers.

U.S. Patent Application Publication No. 2014/0160608 discloses an Ethernet filtering circuit including a plurality of transmission channels wherein each channel includes two parallel transmission routes. Each channel includes an autotransformer in parallel connection with the two routes and two capacitors series connection with the two routes, respectively. The channels do not include any common mode chokes.

SUMMARY OF THE INVENTION

Accordingly, an object of the present invention is to provide a printed circuit board assembly for transmitting network signals. The printed circuit board assembly includes a printed circuit board, a plurality of electronic components mounted thereon, and a plurality of conductive traces electrically connecting the components to form a plurality of transmission channels. Each of the channels has first and second transmission routes for transmitting differential signals. Each channel includes a common mode choke, an autotransformer, and a pair of capacitors electrically connected therebetween. The common mode choke includes a first coil series connection with the first transmission route and a second coil series connection with the second transmission route. The capacitors include a first capacitor series connection with the first transmitting route and a second capacitor series connection with the second transmitting route. The autotransformer includes a third coil with first and second ends and a fourth coil with third and fourth ends. The first end is electrically connected to the first transmitting route. The second end is electrically connected to the third end through the conductive trace to form a center tap. The fourth end is electrically connected to the second transmitting route. The capacitors are rectangular capacitors and surface-mounted upon the PCB. The common mode choke has a bar-shaped core wherein the first coil and the second coil are wound therearound. The common mode choke is surface-mounted upon the PCB. The autotransformer has a toroidal core wherein the third coil and fourth coil are wound therearound.

Notably, each of the transmission channels with a series connection common mode choke, an autotransformer, and a pair of capacitors series connection therebetween result in a better electrical performance in EMI (electromagnetic interference) and EMC (electro magnetic compatibility). The autotransformer is formed with a toroidal core which has a large inductance than a bar-shaped core's. The autotransformer has two coils short connecting through the conductive trace of PCB that the autotransformer is easily manufactured. The combination of bar-shaped common modes choke and toroidal autotransformer is cheaper than the combination of bar-shaped common modes choke and bar-shaped autotransformer, and also cheaper than the combination of toroidal common modes choke and toroidal autotransformer. The electrical performance of combination of bar-shaped common modes choke and toroidal autotransformer is also better than the two other combinations.

Another approach is to provide two autotransformers of the two channels share one common magnetic core. The autotransformers with sharing one common magnetic core are cheaper than each autotransformer has one magnetic core. Moreover, the autotransformers with sharing one common magnetic core could bear a large surge than the autotransformers each with a magnetic core. Alternatively, in another embodiment, four autotransformers of the four channels share one common magnetic core.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to some preferred embodiments of the present invention.

Figure 1:
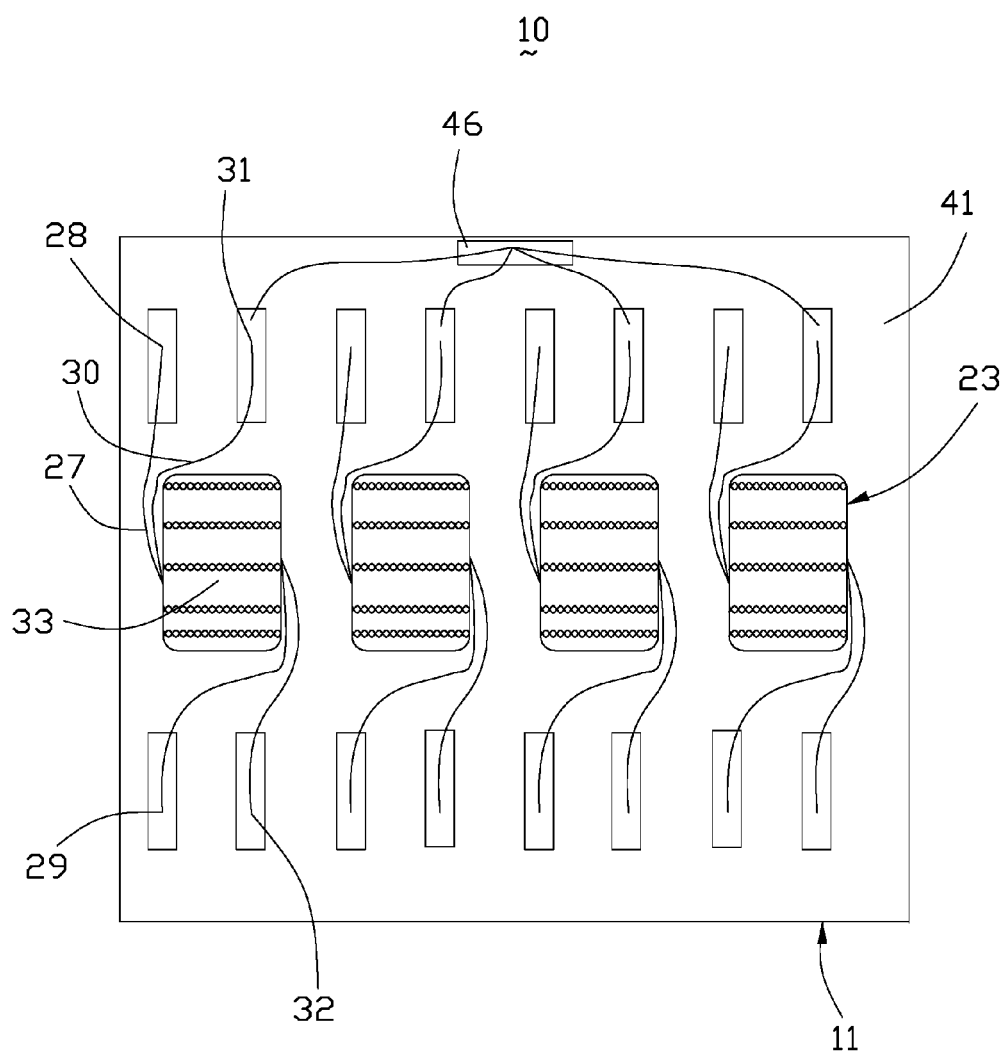
FIG. 1 is a top view of the printed circuit board assembly according to a first embodiment of the invention.
Figure 2:
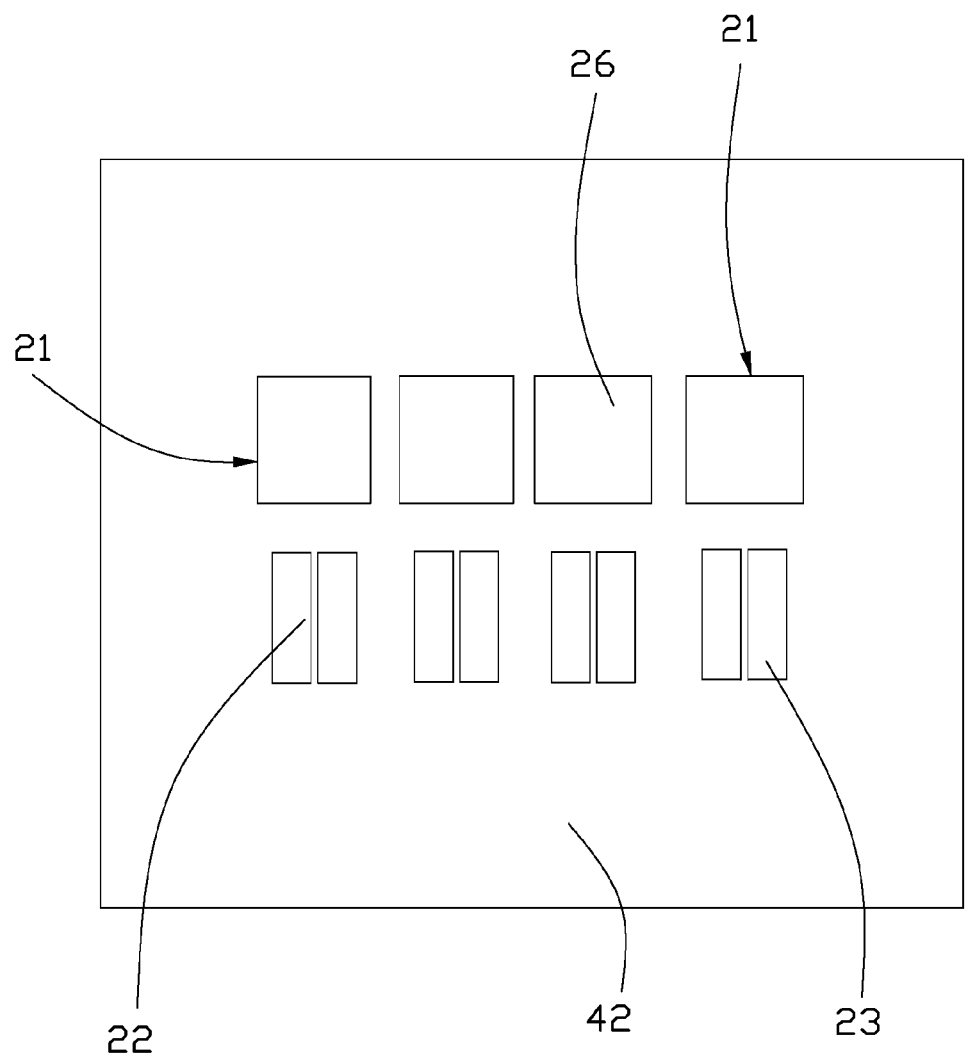
FIG. 2 is a bottom view of the printed circuit board assembly of FIG. 1.
Figure 3:
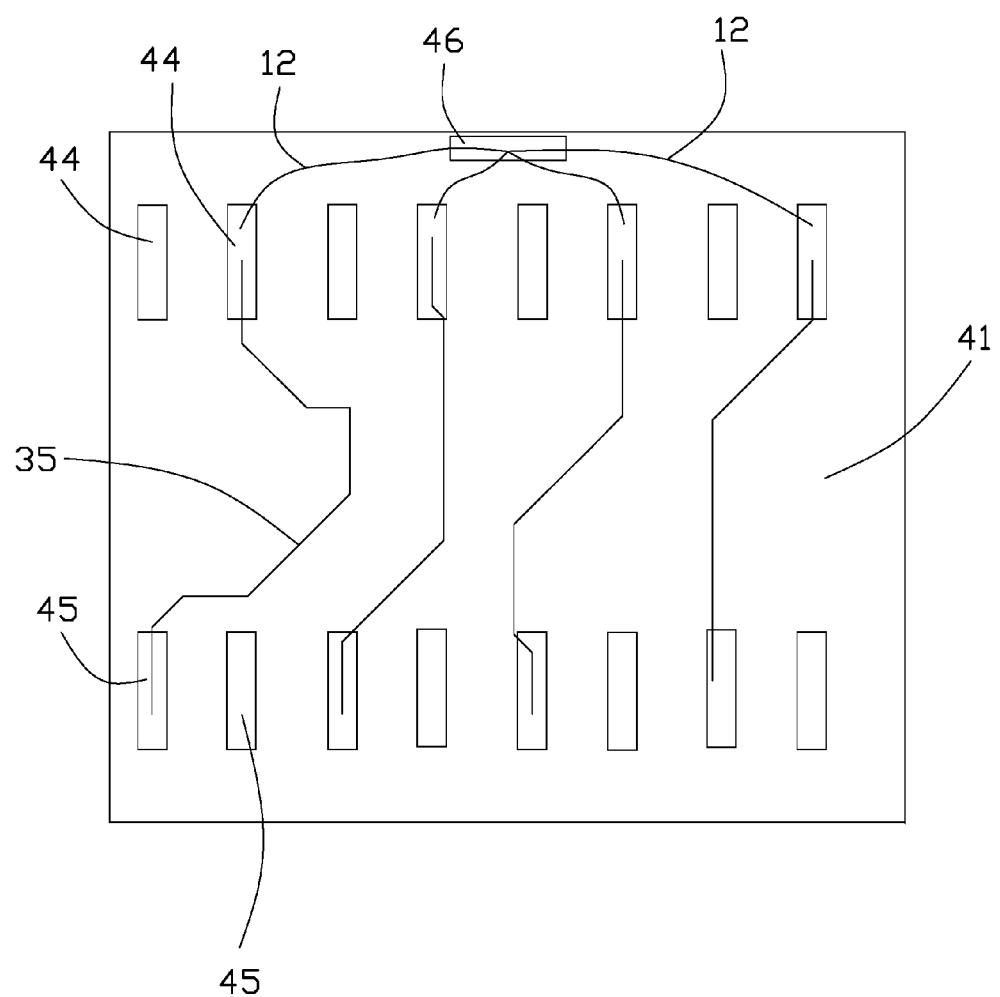
FIG. 3 is a top view of the printed circuit board of FIG. 1, with the autotransformers being removed.
Figure 4:
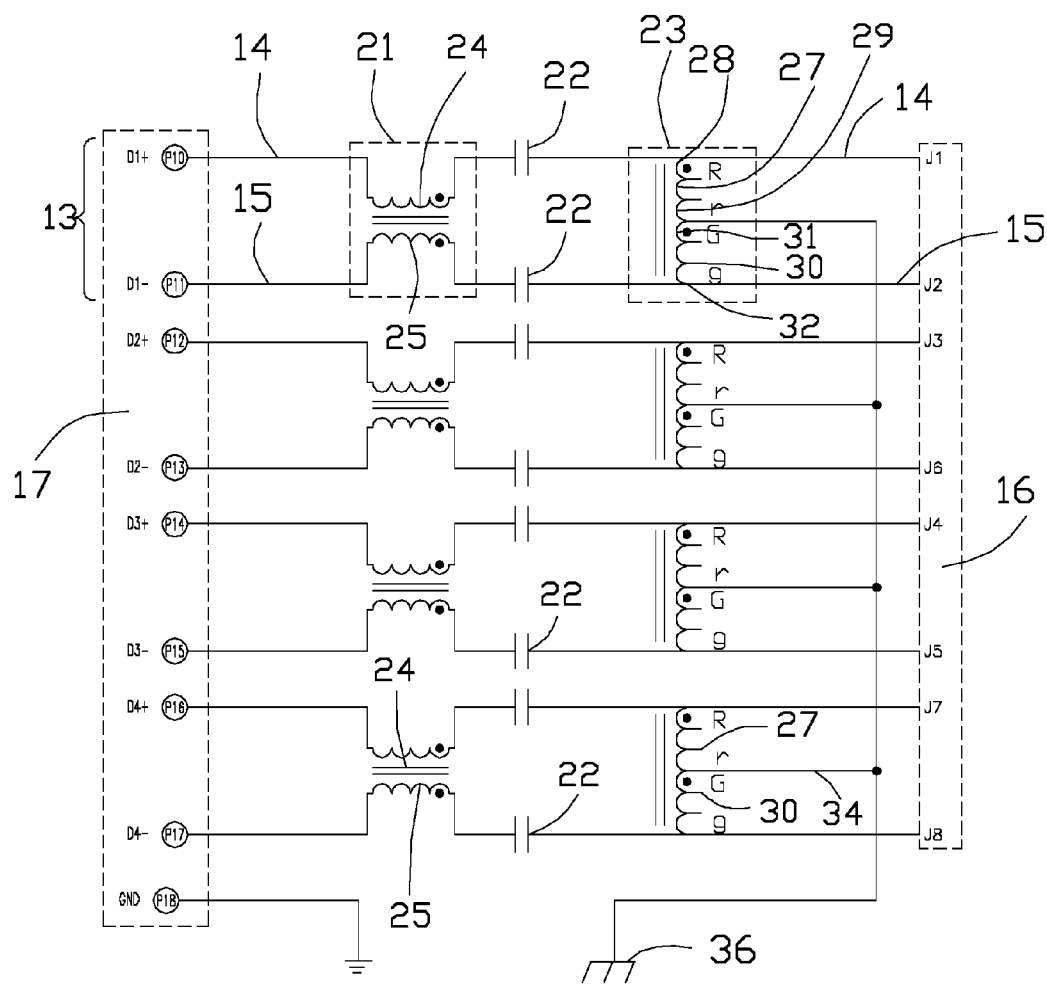
FIG. 4 is a printed circuit board assembly circuit diagram of FIG. 1.

Referring to FIGS. 1 to 4, a printed circuit board assembly 10 according to a first embodiment of the invention. The printed circuit board assembly 10 is used for transmitting network signals and filtering noise.

The printed circuit board assembly 10 includes a printed circuit board (PCB) 11, a plurality of electronic components mounted thereon, and a plurality of conductive traces 12 electrically connecting the components to form a plurality of transmission channels 13.

Each of the channels 13 has a first transmission route 14 and a second transmission route 15 transmitting differential signals. Each of the first transmission route 14 and the second transmission route 15 has two opposite ends electrically connected to a cable side 16 and a physical side 17, respectively. Each of the channels 13 has a common mode choke 21, a pair of capacitors 22, and an autotransformer 23. The capacitors 22 are electrically connected between the common mode choke 21 and the autotransformer 23. The autotransformers 23 are mounted upon a first surface 41 of the PCB 11 while the common mode cokes 21 and capacitors 22 are mounted upon a second surface 42 opposite to the first surface 41. The autotransformers 23 are arranged in a first row along a transverse direction. The common mode chokes 21 are arranged in a second row along the transverse direction. The capacitors 22 are arranged in a third row along the transverse direction.

The common mode choke 21 includes a first coil 24 series connection with the first transmission route 14 and a second coil 25 series connection with the second transmission route 15. The common mode choke 21 is surface-mounted upon the PCB 11 with a bar-shaped core 26 wherein the first coil 24 and the second coil 25 are wound therearound.

The capacitors 22 include a first capacitor 22 series connection with the first transmitting route 14 and a second capacitor 22 series connection with the second transmitting route 15. The capacitors 22 are rectangular capacitors and surface-mounted upon the PCB 11.

The autotransformer 23 includes a third coil 27 with a first end 28 and a second end 29, a fourth coil 30 with a third end 31 and a fourth end 32, and a toroidal core 33 with a axis through-hole extending along the transverse direction. The third coil 27 and the fourth coil 30 are wound around the toroidal core 33 wherein the winding sections of the third and fourth coils 31, 32 are intertwined with each other and the other sections of the third and fourth coils 31, 32 are dispersed with each other. The first end 28 is electrically connected to the first transmission route 14. The second end 29 is electrically connected with the third end 31 to form a center tap 34 through an inclined trace 35. The center tap 34 is directly electrically connected to a ground node 36. The fourth end 32 is electrically connected to the second transmission route 15.

A pair of first conductive pads 44 and a pair of second conductive pads 45 are exposed on the first surface 41 of the PCB 11 wherein the second conductive pads 45 are aligned with the pair of first conductive pads 44 along a second direction perpendicular to the transverse direction. The toroidal core 33 is arranged between the pair of the first conductive pads 44 and the pair of second conductive pads 45. The lines connected between the pair of the first conductive pad 44 and second conductive pads 45 form a rectangle boundary with a short axis along the transverse direction and a long axis along the second direction perpendicular to the transverse direction. The inclined trace 35 is connected with the first conductive pad 44 and the second conductive pad 45 arranged at a diagonal corner of the rectangle boundary. The ends of the third coil 27 are connected with the first conductive pad 44 and the second pad 45 arranged along the second direction, and the ends of the fourth coil 28 are connected to the first conductive pad 44 and the second pad 45 arranged along the second direction. The PCB 11 has a grounding pad 46 exposed on the first surface 41 and corresponding to the ground node 36. The grounding pad 46 is electrically connected to the inclined trace 35 only through the conductive trace 12 and one of the first and second conductive pads 44, 45.

The plurality of transmission channels 13 include four transmission channels 13 when the printed circuit board assembly 10 is used in 1000 Mbps network or a higher speed network. The plurality of transmission channels 13 only include two transmission channels 13 when the printed circuit board assembly 10 is used in 10/100 Mbps network.

Figure 5:
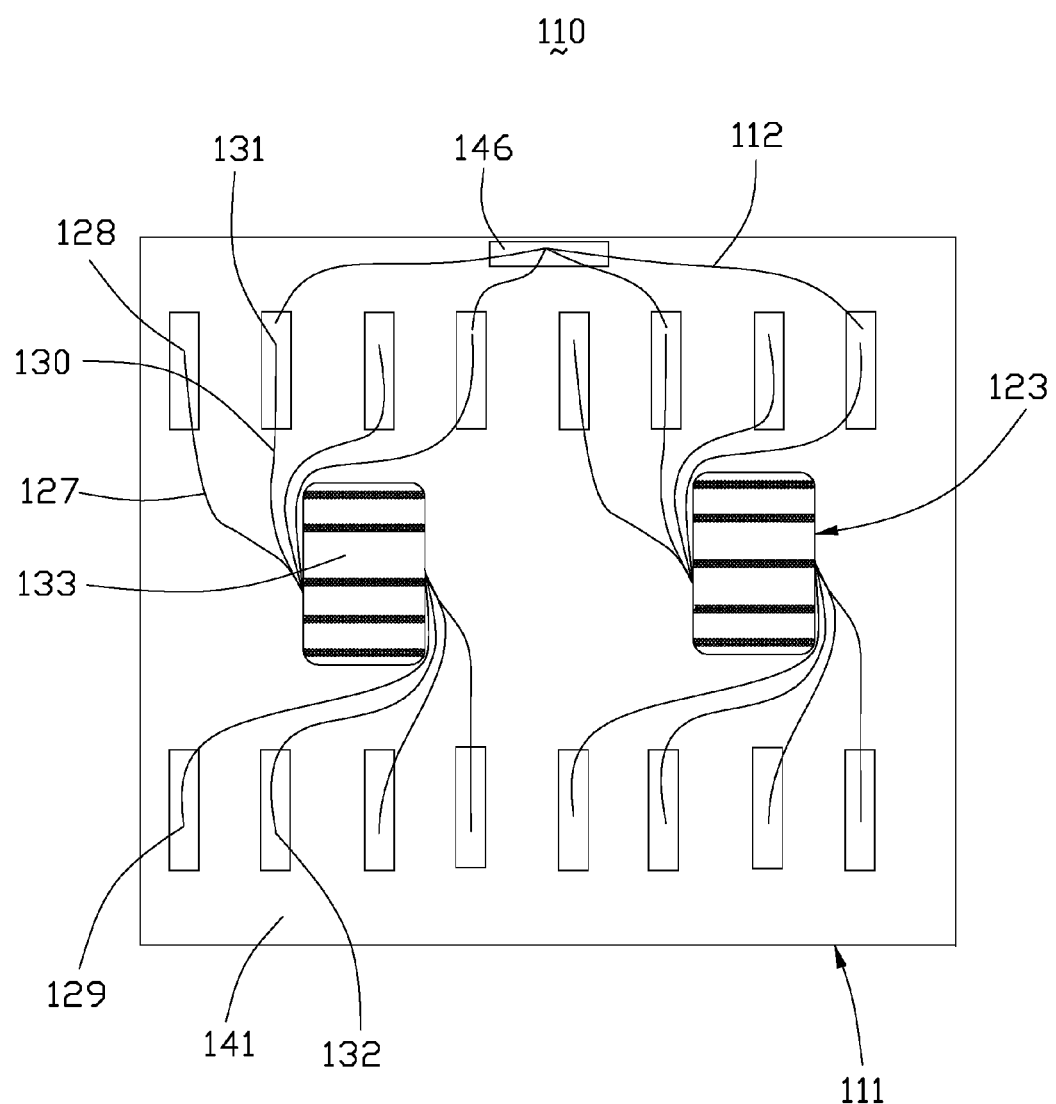
FIG. 5 is a top view of the printed circuit board assembly according to a second embodiment of the invention.
Figure 6:
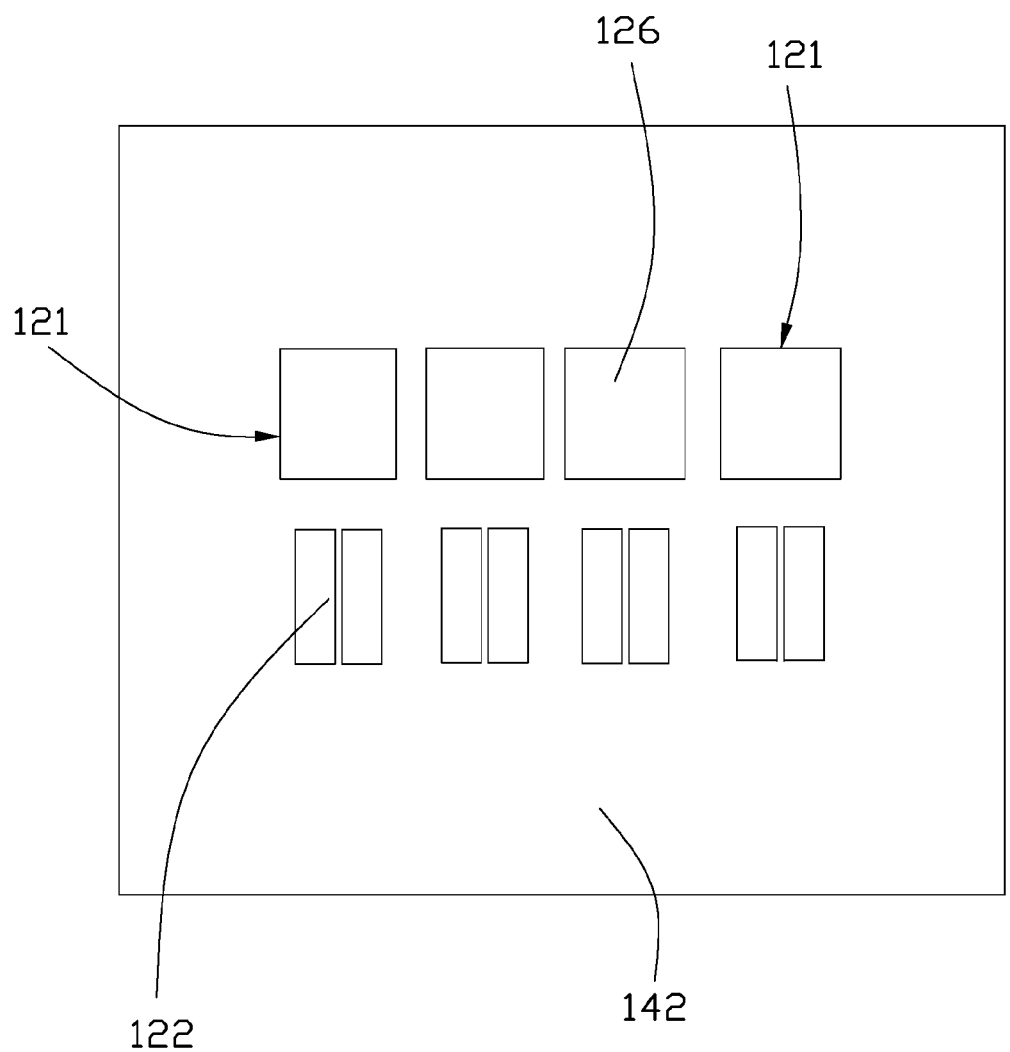
FIG. 6 is a bottom view of the printed circuit board assembly of FIG. 5.
Figure 7:
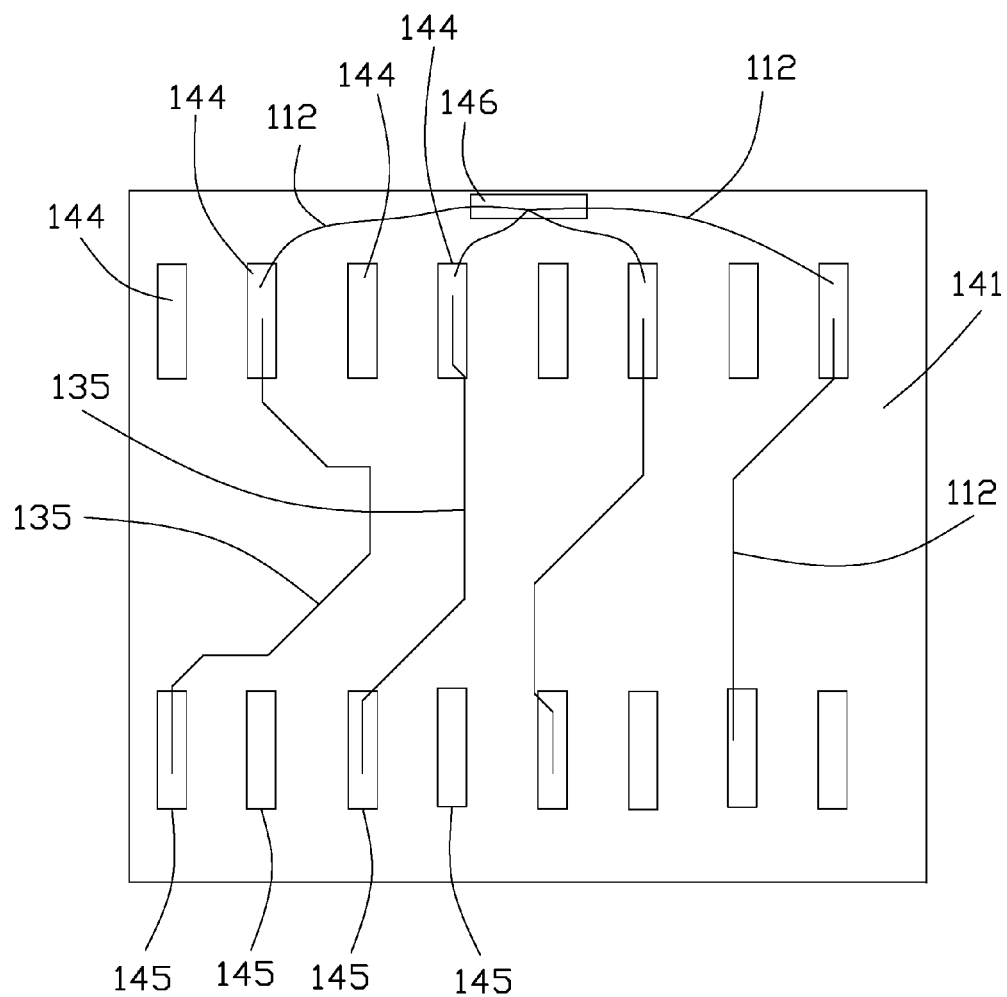
FIG. 7 is a top view of the printed circuit board of FIG. 5, with the autotransformers being removed.
Figure 8:
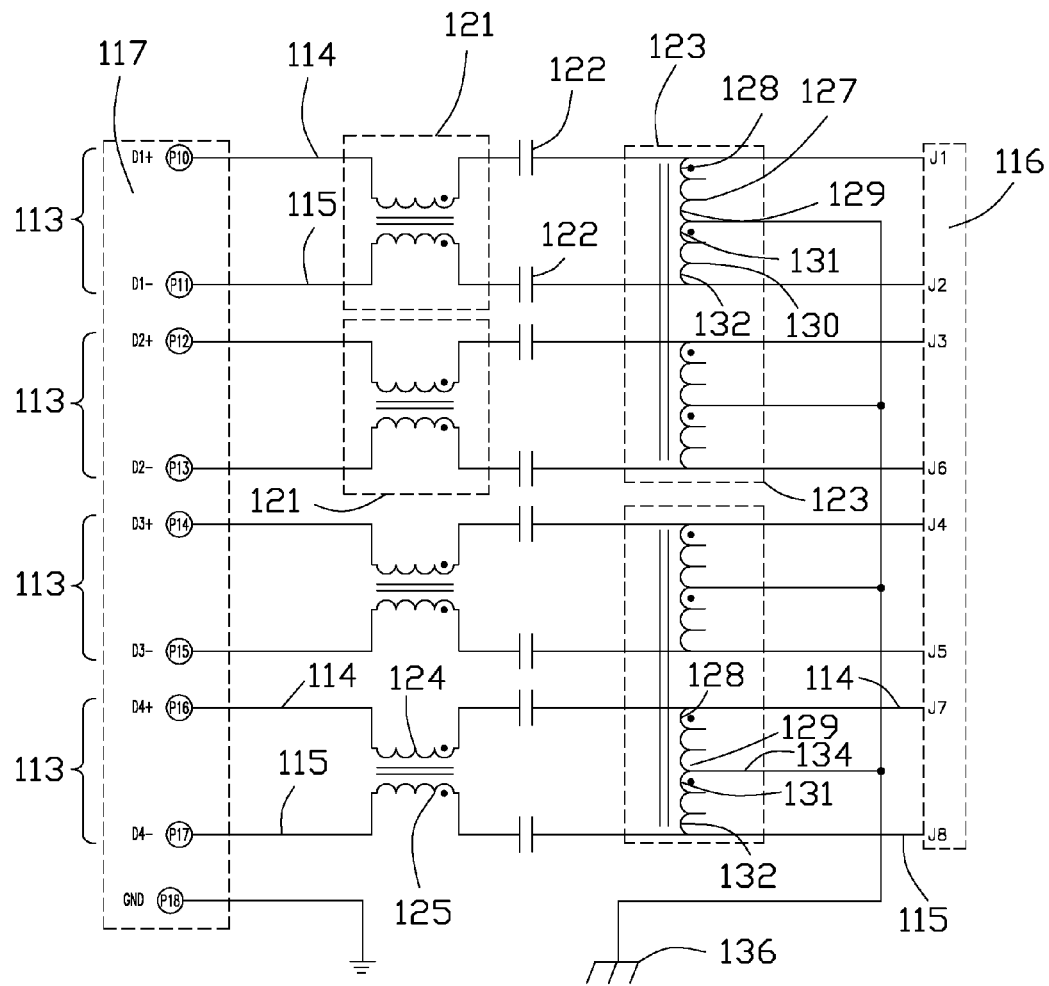
FIG. 8 is a printed circuit board assembly circuit diagram of FIG. 5.

Referring to FIGS. 5 to 8, the printed circuit board assembly 110 of a second embodiment includes the similar basic circuit diagram with the first embodiment disclosed in FIGS. 1-4 except the two transmission channels share only one magnetic core functioning as two autotransformers used for two corresponding channels.

The printed circuit board assembly 110 includes a printed circuit board (PCB) 111, a plurality of electronic components mounted thereon, and a plurality of conductive traces 112 electrically connecting the components to form a plurality of transmission channels 113.

Each of the channels 113 has a first transmission route 114 and a second transmission route 115 transmitting differential signals. Each of the first transmission route 114 and the second transmission route 115 has two opposite ends electrically connected to a cable side 116 and a physical side 117, respectively. Each of the channels 113 has a common mode choke 121, a pair of capacitors 122, and an autotransformer 123. The capacitors 122 are electrically connected between the common mode choke 121 and the autotransformer 123. The autotransformers 123 are mounted upon a first surface 141 of the PCB 111 while the common mode cokes 121 and capacitors 122 are mounted upon a second surface 142 opposite to the first surface 111. The autotransformers 123 are arranged in a first row along the transverse direction. The common mode chokes 121 are arranged in a second row along the transverse direction. The capacitors 122 are arranged in a third row along the transverse direction.

The common mode choke 121 includes a first coil 124 series connection with the first transmission route 114 and a second coil 125 series connection with the second transmission route 115. The common mode choke 121 is surface-mounted upon the PCB 111 with a bar-shaped core 126 wound around with the first coil 124 and the second coil 125.

The capacitors 122 include a first capacitor 122 series connection with the first transmitting route 114 and a second capacitor 122 series connection with the second transmitting route 115. The capacitors 122 are rectangular capacitors and surface-mounted upon the PCB 111.

The autotransformer 123 includes a third coil 127 with a first end 128 and a second end 129, a fourth coil 130 with a third end 131 and a fourth end 132, and a toroidal core 133 wound around with the third coil 127 and the fourth coil 130. The first end 128 is electrically connected to the first transmission route 114. The second end 129 is electrically connected with the third end 131 through an inclined trace 135 to form a center tap 134 directly electrically connected to a ground node 136. The fourth end 132 is electrically connected to the second transmission route 115.

Four first conductive pads 144 and four second conductive pads 145 exposed on the first surface 141 of the PCB 111 wherein the second conductive pads 145 are aligned with the first conductive pads 144 along a second direction perpendicular to the transverse direction. The toroidal core 133 is arranged between the four first conductive pads 144 and the four second conductive pads 145. The lines connected between the four first conductive pads 144 and the four second conductive pads 145 form two rectangle boundary each with a short axis along the transverse direction and a long axis along the second direction perpendicular to the transverse direction. The inclined traces 135 are connected with the first conductive pad 144 and the second conductive pad 145 arranged at a diagonal corner of the rectangle boundary. The ends of the third coil 127 are connected with the first conductive pad 144 and the second pad 145 arranged along the second direction, and the ends of the fourth coil 128 are connected to the first conductive pad 144 and the second pad 145 arranged along the second direction. The two autotransformers 123 of two transmission channels 113 share only one toroidal core 133 wound around four coils with a pair of the third and fourth coils 127, 130. The PCB 111 has a grounding pad 146 exposed on the first surface 141 and corresponding to the ground node 136. The grounding pad 146 is electrically connected to the inclined traces 135 only through the conductive traces 112 and two of the first and second conductive pads.

In one embodiment, the printed circuit board assembly 10, 110 is disposed within a RJ-45 receptacle connector. In another embodiment, the printed circuit board assembly 10, 110 is mounted upon a mother board which a RJ-45 receptacle connector stands thereon and electrically connected to the printed circuit board assembly 10, 110 through the mother board. In one another embodiment, the printed circuit board assembly 10, 110 is the mother board which has a RJ-45 receptacle connector standing thereon.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board assembly for transmitting network signals, comprising:
a printed circuit board (PCB), a plurality of electronic components mounted thereon, and a plurality of conductive traces electrically connecting the plurality of electronic components to form a plurality of transmission channels, each of the transmission channels having corresponding first and second transmission routes for transmitting differential signals and comprising:
a common mode choke including a first coil connected in series with the first transmission route and a second coil connected in series with the second transmission route,
an autotransformer including a third coil with first and second ends and a fourth coil with third and fourth ends, the first end electrically connected to the first transmitting route, the second end electrically connected to the third end through one of the plurality of conductive traces to form a center tap, the fourth end electrically connected to the second transmitting route,
a pair of capacitors electrically connected between the common mode choke and the autotransformer, the pair of capacitors including a first capacitor connected in series with the first transmitting route and a second capacitor connected in series with the second transmitting route,
wherein the pair of capacitors are rectangular capacitors surface-mounted upon the PCB,
wherein the common mode choke has a bar-shaped core with the first coil and the second coil wound therearound, the common mode choke surface-mounted upon the PCB, and
wherein the autotransformer has a toroidal core with the third coil and fourth coil wound therearound, the PCB having a plurality of conductive pads for the ends of the third coil and the fourth coil soldered thereon.

2. The printed circuit board assembly as recited in claim 1, wherein for each of the plurality of transmission channels: the plurality of conductive pads include a pair of first conductive pads and a pair of second conductive pads parallel to the pair of first conductive pads, the toroidal core arranged between the pair of the first conductive pads and the pair of second conductive pads.

3. The printed circuit board assembly as recited in claim 2, wherein imaginary lines connected between the pair of first and the pair of second conductive pads of each of the plurality of transmission channels form a rectangle boundary with a short axis along a first direction and a long axis along a second direction perpendicular to the first direction.

4. The printed circuit board assembly as recited in claim 3, wherein the plurality of conductive traces include an inclined trace connected between one of the pair of first conductive pads and one of the pair of second conductive pads of each of the plurality of transmission channels and arranged at a diagonal corner of the corresponding rectangle boundary.

5. The printed circuit board assembly as recited in claim 4, wherein the PCB has a grounding pad exposed on the first surface, the grounding pad electrically connected to the inclined trace of each of the plurality of transmission channels.

6. The printed circuit board assembly as recited in claim 3, wherein said toroidal core of each of the plurality of transmission channels forms an axis hole extending therethrough along the first direction.

7. The printed circuit board assembly as recited in claim 3, wherein for each of the plurality of transmission channels: the ends of the third coil are connected with one of the pair of first conductive pads and one of the pair of second pads arranged along the second direction, and the ends of the fourth coil are connected to the other one of the pair of first conductive pads and the other one of the pair of second conductive pads arranged along the second direction.

8. The printed circuit board assembly as recited in claim 1, wherein each of the autotransformers are mounted upon a first surface of the PCB, and each of the common mode chokes and the pair of capacitors are mounted upon a second surface opposite to the first surface.

9. A printed circuit board assembly for transmitting network signals, comprising:
a printed circuit board (PCB), a plurality of electronic components mounted thereon, and a plurality of conductive traces electrically connecting the plurality of electronic components to form two transmission channels, each of the channels having corresponding first and second transmission routes for transmitting differential signals and comprising:
a common mode choke including a first coil connected in series with the first transmission route and a second coil connected in series with the second transmission route,
a pair of capacitors including a first capacitor connected in series with—the first transmitting route and a second capacitor connected in series with the second transmitting route, and
an autotransformer including a third coil with first and second ends, a fourth coil with third and fourth ends, and a magnetic core wound around with the third and fourth coils, the first end electrically connected to the first transmitting route, the second end electrically connected to the third end through one of the plurality of conductive traces, the fourth end electrically connected to the second transmitting route;
wherein the two transmission channels commonly share the same magnetic core.

10. The printed circuit board assembly as recited in claim 9, wherein the autotransformer of each of the two transmission channels has four coils wound around the magnetic core, the PCB having eight conductive pads for the corresponding ends of the four coils to be soldered thereon.

11. The printed circuit board assembly as recited in claim 10, wherein the eight conductive pads include four first conductive pads and four second conductive pads disposed at two parallel rows, the autotransformer of each of the two transmission channels is arranged between the two parallel rows.

12. The printed circuit board assembly as recited in claim 11, wherein imaginary lines connected between the four first conductive pads and the four second conductive pads form two rectangle boundaries each of which has a short axis along a first direction and a long axis along a second direction perpendicular to the first direction.

13. The printed circuit board assembly as recited in claim 12, wherein the plurality of conductive traces include two inclined traces, each of which is connected between one of four first conductive pads and one of four second conductive pads.

\* \* \* \* \*